United States Patent
Mizoguchi (10) Patent No.: US 10,139,453 B2
(45) Date of Patent: Nov. 27, 2018

(54) BATTERY VOLTAGE MONITORING DEVICE USING CAPACITOR CIRCUIT AND SWITCH FAILURE DETECTION CIRCUIT

(71) Applicant: DENSO CORPORATION, Kariya, Aichi-pref. (JP)

(72) Inventor: Tomomichi Mizoguchi, Inazawa (JP)

(73) Assignee: DENSO CORPORATION, Kariya (JP)

( * ) Notice: Subject to any disclaimer, the term of this patent is extended or adjusted under 35 U.S.C. 154(b) by 425 days.

(21) Appl. No.: 14/156,930

(22) Filed: Jan. 16, 2014

(65) Prior Publication Data
US 2014/0197841 A1 Jul. 17, 2014

(30) Foreign Application Priority Data

Jan. 16, 2013 (JP) ................................. 2013-005622

(51) Int. Cl.
*G01R 31/36* (2006.01)
*B60L 11/18* (2006.01)
*B60L 3/00* (2006.01)

(52) U.S. Cl.
CPC ........ *G01R 31/3658* (2013.01); *B60L 3/0046* (2013.01); *B60L 11/1851* (2013.01); *B60L 11/1853* (2013.01); *B60L 2240/547* (2013.01)

(58) Field of Classification Search
CPC .............. G01R 31/282; G01R 31/3658; G01R 31/3606; G01R 31/362; G01R 31/3637; G01R 19/16542; G01N 17/02
(Continued)

(56) References Cited

U.S. PATENT DOCUMENTS 3,931,737 A * 1/1976 Conkling .................. G01F 1/72
340/870.35
4,071,822 A * 1/1978 Kamiya ................. G01R 19/12
324/111
(Continued)

FOREIGN PATENT DOCUMENTS

JP 10-179531 7/1998
JP 11-122056 4/1999
(Continued)

OTHER PUBLICATIONS

"5 reasons why grounding electrical currents is a must," BAMS Electrical Services LLC, Published Online Dec. 15, 2012, Accessed Jun. 21, 2017, bamselectrical.com/5-reasons-why-grounding-electrical-currents-is-a-must/.*
(Continued)

*Primary Examiner* — Robert Grant
*Assistant Examiner* — John Trischler
(74) *Attorney, Agent, or Firm* — Nixon & Vanderhye PC (57) ABSTRACT

In a voltage monitoring apparatus, a capacitor circuit includes at least one capacitor. Input-side switches are connected to electrode terminals of at least one battery cell, and apply voltage to terminals of the capacitor. A voltage detection circuit includes a pair of voltage sensing terminals connected to terminals of the capacitor, and detects the potential difference across voltage sensing terminals. Output-side switches are connected to terminals of the capacitor, and apply voltage across terminals of the capacitor to the voltage sensing terminals. An impedance circuit is connected to the voltage sensing terminals. A stabilizing power circuit is connected to the voltage sensing terminals via the impedance circuit, and stabilizes voltage of the voltage sensing terminals. Based on the detected voltage when one of the output-side switches is turned on, an on-failure of the (Continued)

remaining output-side switches which should not be turned on are detected by a control unit.

10 Claims, 8 Drawing Sheets

(58) Field of Classification Search
USPC .................. 324/425, 434, 426, 429, 433
See application file for complete search history.

(56) References Cited

U.S. PATENT DOCUMENTS

| | | | | |
|---|---|---|---|---|
| 4,281,290 | A * | 7/1981 | Peacey | G01R 15/09 324/133 |
| 4,460,870 | A * | 7/1984 | Finger | G01R 31/362 320/136 |
| 5,172,044 | A * | 12/1992 | Sasaki | H02J 7/008 320/160 |
| 5,302,902 | A * | 4/1994 | Groehl | G01R 19/16542 320/DIG. 13 |
| 6,157,171 | A * | 12/2000 | Smith | G01R 19/16542 320/133 |
| 6,249,753 | B1 | 6/2001 | Mason et al. | |
| 6,324,042 | B1 * | 11/2001 | Andrews | G01R 31/00 323/283 |
| 6,362,627 | B1 * | 3/2002 | Shimamoto | G01R 19/25 324/434 |
| 6,570,387 | B2 * | 5/2003 | Maki | B60L 11/1853 324/434 |
| 6,639,408 | B2 * | 10/2003 | Yudahira | G01R 31/3658 324/434 |
| 6,639,409 | B2 * | 10/2003 | Morimoto | G01R 31/3658 324/434 |
| 6,670,791 | B1 * | 12/2003 | Smith | H01M 10/44 320/134 |
| 6,677,758 | B2 * | 1/2004 | Maki | G01R 31/3658 324/429 |
| 6,803,766 | B2 * | 10/2004 | Kobayashi | G01R 31/3658 320/116 |
| 7,078,908 | B2 * | 7/2006 | Fujita | G01R 31/3658 320/116 |
| 7,126,342 | B2 * | 10/2006 | Iwabuchi | G01R 19/16542 320/116 |
| 7,719,284 | B2 * | 5/2010 | Ohta | G01R 31/3658 320/116 |
| 7,812,568 | B2 * | 10/2010 | Yonezawa | G01R 19/16542 320/116 |
| 7,924,016 | B2 * | 4/2011 | Shimizu | G01R 19/2503 320/163 |
| 7,928,744 | B2 * | 4/2011 | Price | G01R 19/1659 320/134 |
| 8,248,744 | B2 * | 8/2012 | Kawamura | G01R 19/0084 361/79 |
| 9,007,066 | B2 * | 4/2015 | Sufrin-Disler | H02J 7/0016 324/433 |
| 9,470,761 | B2 * | 10/2016 | Kiuchi | G01R 31/3606 |
| 9,568,555 | B2 * | 2/2017 | Nortman | H02J 7/0016 |
| 9,588,181 | B2 * | 3/2017 | Nortman | H02J 7/0016 |
| 2001/0048307 | A1 * | 12/2001 | Maki | B60L 11/1853 324/387 |
| 2003/0052688 | A1 | 3/2003 | Yudahira et al. | |
| 2003/0189419 | A1 * | 10/2003 | Maki | G01R 31/3658 320/166 |
| 2004/0051534 | A1 * | 3/2004 | Kobayashi | G01R 19/16542 324/429 |
| 2004/0160229 | A1 * | 8/2004 | Fujita | G01R 31/3658 324/607 |
| 2004/0212347 | A1 * | 10/2004 | Fogg | G01R 31/3606 320/127 |
| 2006/0132139 | A1 * | 6/2006 | Ohta | G01R 31/3658 324/426 |
| 2006/0186894 | A1 * | 8/2006 | Iwabuchi | G01R 19/16542 324/607 |
| 2007/0024241 | A1 * | 2/2007 | Bean | H02J 7/0031 320/132 |
| 2008/0103707 | A1 * | 5/2008 | Iwasaki | H02J 7/0021 702/58 |
| 2008/0265901 | A1 * | 10/2008 | Shimizu | G01R 19/2503 324/434 |
| 2008/0310063 | A1 * | 12/2008 | Kawamura | G01R 19/0084 361/79 |
| 2010/0244847 | A1 | 9/2010 | Kudo et al. | |
| 2011/0031812 | A1 * | 2/2011 | Morimoto | G01R 19/10 307/77 |
| 2011/0196632 | A1 * | 8/2011 | Shimizu | G01R 31/3658 702/63 |
| 2012/0112785 | A1 * | 5/2012 | Mizoguchi | G01R 19/16542 324/762.08 |
| 2012/0139495 | A1 * | 6/2012 | Nortman | H02J 7/0016 320/128 |
| 2012/0139549 | A1 * | 6/2012 | Sufrin-Disler | H02J 7/0016 324/433 |
| 2012/0139553 | A1 * | 6/2012 | Nortman | H02J 7/0016 324/537 |
| 2012/0146652 | A1 * | 6/2012 | Aoki | G01R 31/3658 324/433 |
| 2012/0253716 | A1 * | 10/2012 | Tsuchiya | G01R 31/362 702/63 |
| 2013/0057294 | A1 * | 3/2013 | Mizoguchi | G01R 31/362 324/434 |
| 2013/0285667 | A1 * | 10/2013 | Koduka | G01R 19/0084 324/433 |
| 2013/0320991 | A1 * | 12/2013 | Kiuchi | G01R 31/3606 324/434 |
| 2014/0159739 | A1 | 6/2014 | Kudo et al. | |
| 2015/0070023 | A1 * | 3/2015 | Kudo | H01M 10/482 324/426 |
| 2015/0198671 | A1 * | 7/2015 | Nortman | H02J 7/0016 324/426 |
| 2015/0200552 | A1 * | 7/2015 | Nortman | H02J 7/0016 320/134 |
| 2015/0323609 | A1 * | 11/2015 | Kudo | G01R 1/28 324/433 |
| 2016/0061903 | A1 * | 3/2016 | Deriha | G01R 31/362 324/426 |
| 2017/0003350 | A1 * | 1/2017 | Kiuchi | G01R 31/3606 |

FOREIGN PATENT DOCUMENTS

| | | | |
|---|---|---|---|
| JP | 2002-281681 | | 9/2002 |
| JP | 2002281681 | A * | 9/2002 |
| JP | 2002-533706 | | 10/2002 |
| JP | 2002-350472 | | 12/2002 |
| JP | 2004-170146 | | 6/2004 |
| JP | 3627922 | | 12/2004 |
| JP | 2008-079415 | | 4/2008 |
| JP | 2009-094853 | | 4/2009 |
| JP | 2010-249793 | | 11/2010 |

OTHER PUBLICATIONS

Office Action (2 pgs.) dated Aug. 18, 2015 issued in corresponding Japanese Application No. 2013-005622 with an at least partial English-language translation (2 pgs.).

Office Action (2 pages) dated Jan. 6, 2015, issued in corresponding Japanese Application No. 2013-005622 and English translation (4 pages).

* cited by examiner

BATTERY VOLTAGE MONITORING DEVICE USING CAPACITOR CIRCUIT AND SWITCH FAILURE DETECTION CIRCUIT

CROSS-REFERENCE TO RELATED APPLICATION

This application is based on and claims the benefit of priority from Japanese Patent Application No. 2013-005622, filed Jan. 16, 2013, the disclosure of which is incorporated herein in its entirety by reference.

BACKGROUND

Technical Field

The present invention relates to a flying capacitor type voltage monitoring apparatus that uses a capacitor to monitor the voltage of a battery.

Related Art

A well-known battery monitoring apparatus based on related art, as disclosed in, for example, JP-B-3627922, monitors the voltage of a battery using a flying capacitor method. According to the flying capacitor method, the voltage of a battery is applied to a capacitor, and then the voltage applied to the capacitor is detected as a voltage of the battery.

JP-B-3627922 discloses a technique of detecting an on-failure (closing failure) of any of a plurality of input-side switches which are provided to turn on/off the connection of both terminals of a capacitor to both terminals of a battery. When an on-failure of a switch has occurred, the switch has been kept on and fails to be turned off. Specifically, JP-B-3627922 focuses on the matter that the voltage of the battery is applied to the capacitor when one of the input-side switches is turned on in a state where an on-failure has occurred in the input-side switches. Thus, the on-failure of the input-side switches can be detected on the basis of the voltage of the capacitor in turning on one of the input-side switches.

However, JP-B-3627922 just discloses detection of an on-failure in the input-side switches, but is silent about an on-failure in a plurality of output-side switches that turn on/off connection of both terminals of the capacitor to the voltage sensing terminals of the voltage detection circuit.

Similar to the detection of an on-failure in the input-side switches, an on-failure in the output-side switches may be detected on the basis of the detected voltage of the voltage detection circuit in turning on one of the output-side switches.

However, in turning on one of the output-side switches and turning off the rest of the output-side switches, the voltage sensing terminals of the voltage detection circuit, which correspond to the rest of the switches, will have high impedance. This may allow the voltage inputted to the voltage detection circuit to be unstable. Thus, voltage cannot be correctly detected in the voltage detection circuit. Therefore, an on-failure in the output-side switches cannot be detected by the voltage monitoring apparatus.

SUMMARY

It is thus desired to provide a voltage monitoring apparatus which is able to detect an on-failure in output-side switches.

According to an exemplary embodiment of the present disclosure, there is provided a voltage monitoring apparatus including: a capacitor circuit including at least one capacitor; an input-side switch group that includes a plurality of input-side switches connected to at least one pair of electrode terminals of at least one battery cell and applies voltage to a pair of terminals of the at least one capacitor; a voltage detection circuit that includes at least one pair of voltage sensing terminals connected to each of the terminals of the at least one capacitor and detects a potential difference across the at least one pair of voltage sensing terminals; an output-side switch group that includes a plurality of output-side switches connected to the terminals of the at least one capacitor and applies voltage across the terminals of the at least one capacitor to the at least one pair of voltage sensing terminals; switch control means for controlling each of the plurality of input-side switches and each of the plurality of output-side switches; failure detecting means for detecting, on the basis of the voltage detected by the voltage detection circuit when one of the output-side switches is turned on, an on-failure of at least one of the remaining output-side switches which should not be turned on; an impedance circuit that is connected to each of the at least one pair of voltage sensing terminals; and a stabilizing power circuit that is connected to each of the at least one pair of voltage sensing terminals via the impedance circuit and stabilizes voltage of each of the at least one pair of voltage sensing terminals.

According to this configuration, even when one of the output-side switches is turned on and the rest of them are turned off, the impedance circuit and the stabilizing power circuit can stabilize the voltage of the voltage sensing terminals on the side of the rest of the switches. Thus, when one of the output-side switches is turned on, the potential difference between the voltage sensing terminals can be normally detected by the voltage detection circuit. Accordingly, an on-failure of the output-side switches can be detected.

DESCRIPTION OF EMBODIMENTS

Hereinafter, some embodiments according to the present invention are described with reference to the accompanying drawings. In the following embodiments, the components identical with or similar to each other are given the same reference numerals.

First Embodiment

A first embodiment is described with reference to FIGS. 1 to 5. In the first embodiment, a voltage monitoring apparatus 2 of the present invention is applied to a battery pack 1 which is installed in a vehicle such as a hybrid vehicle or an electric vehicle. In this embodiment, the battery pack 1 and the voltage monitoring apparatus 2 configure a battery system for vehicles.

Figure 1:
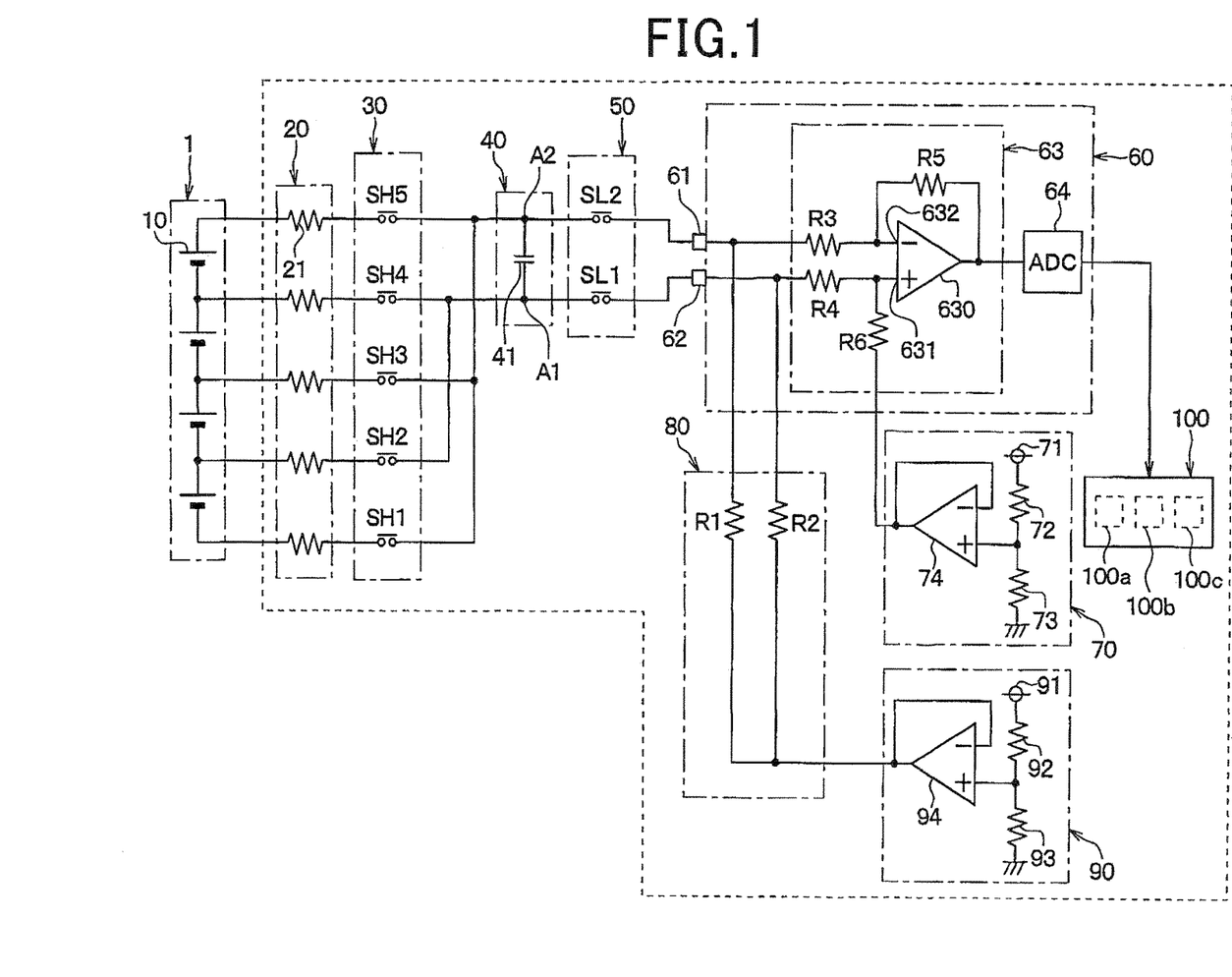
FIG. 1 is a schematic diagram generally showing a voltage monitoring apparatus, according to a first embodiment of the present invention.

The battery pack 1 serves as a power source that supplies electric power chiefly to an electric motor (not shown) used for running the vehicle, as well as various electrical loads mounted to the vehicle. FIG. 1 is a schematic diagram generally illustrating the voltage monitoring apparatus 2. As shown in FIG. 1, the battery pack 1 of the present embodiment is configured as a serial connection in which a plurality of battery cells 10 composed of secondary batteries, such as lithium-ion batteries, are connected in series. For the sake of convenience, FIG. 1 shows an example in which the battery pack 1 is configured by four battery cells 10. However, the number of the battery cells 10 configuring the battery pack 1 is not limited to four.

The voltage monitoring apparatus 2 monitors the voltage of the battery pack 1. The voltage monitoring apparatus 2 is connected across the terminals of each of the battery cells 10 of the battery pack 1 via a plurality of connecting lines.

The voltage monitoring apparatus 2 of the present embodiment includes a current-limiting resistor group 20, an input-side switch group 30, a capacitor circuit 40, an output-side switch group 50, a voltage detection circuit 60, an offset power circuit 70, an impedance circuit 80, a stabilizing power circuit 90, and a control unit 100.

The current-limiting resistor group 20 limits the current passing between the battery pack 1 and the voltage monitoring apparatus 2. This current-limiting resistor group 20 includes current-limiting resistors 21 each of which is connected to a connecting line that is connected across the terminals of the corresponding one of the battery cells 10.

The input-side switch group 30 includes a plurality of input-side switches SH1 to SH5 each of which is connected across the terminals of the corresponding one of the battery cells 10. This input-side switch group 30 serves as a circuit that applies the voltage of one of the battery cells 10, as a target of voltage detection, to a capacitor 41 of the capacitor circuit 40.

In the present embodiment, the input-side switches SH2 and SH4, which fall on an even-number order when the electrode terminals of the battery cells 10 are counted in an ascending order of potential, are connected to one end (one terminal) A1 of the capacitor 41. Also, the input-side switches SH1, SH3 and SH5, which fall on an odd-number order when the electrode terminals of the battery cells 10 are counted in an ascending order of potential, are connected to the other end (the other terminal) A2 of the capacitor 41.

In the present embodiment, adjacent battery cells 10 are connected such that an input-side switch is shared between the negative terminal of the high potential-side battery cell 10 and the positive terminal of the low potential-side battery cell 10. Therefore, when the voltages of adjacent battery cells 10 are sequentially applied to the capacitor 41 by the input-side switch group 30, the polarity of the capacitor 41 is inverted. The input-side switches SH1 to SH5 are semiconductor switches whose on/off state is switched under the control of a command signal from the control unit 100 described later.

The capacitor circuit 40 is configured by the single capacitor 41 of which one terminal A1 is connected to the input-side switches SH2 and SH4, and the other terminal A2 is connected to the input-side switches SH1, SH3 and SH5.

The output-side switch group 50 has first and second output-side switches SL1 and SL2 which are connected to the respective terminals of the capacitor 41. The output-side switch group 50 serves as a circuit that applies the voltage across the terminals of the capacitor 41 to a pair of voltage sensing terminals 61 and 62 of the voltage detection circuit 60.

In the present embodiment, the first output-side switch SL1 connected to the terminal A1 of the capacitor 41 is connected to one voltage sensing germinal 62 of the voltage detection circuit 60. The second output-side switch SL2 connected to the terminal A2 of the capacitor 41 is connected to the other voltage sensing terminal 61 of the voltage detection circuit 60. The output-side switches SL1 and SL2 are semiconductor switches whose on/off state is switched under the control of a command signal from the control unit 100 described later.

The voltage detection circuit 60 detects a potential difference between the pair of voltage sensing terminals 61 and 62 that correspond to the terminals A1 and A2, respectively, of the capacitor 41. The voltage detection circuit 60 of the present embodiment includes the pair of voltage sensing terminals 61 and 62, a differential amplifier circuit 63 and an analog-to-digital converter (AD converter or ADC) 64.

The differential amplifier circuit 63 amplifies and outputs the potential difference between the voltage sensing terminals 61 and 62 of the voltage detection circuit 60. The differential amplifier circuit 63 of the present embodiment includes an operational amplifier 630, a pair of input resistors R3 and R4 for adjusting gain, a feedback resistor R5, and a resistor R6. The operational amplifier 630 has a non-inverted input terminal 631 and an inverted input terminal 632. The input resistors R3 and R4 are connected to the voltage sensing terminals 61 and 62, respectively.

The AD converter (ADC) 64 converts an output voltage (analog signal) outputted from the differential amplifier circuit 63 into a digital signal and outputs the converted signal to the control unit 100. The AD converter 64 of the present embodiment is configured by a circuit that is able to perform AD conversion when an inputted analog signal has a positive voltage.

The offset power circuit 70 adds an offset voltage (e.g., 2.5 V) to the output signal of the differential amplifier circuit 63 in order for an analog signal having a negative voltage not to be inputted to the AD converter 64.

The offset power circuit 70 of the present embodiment is configured to generate an offset voltage by dividing the voltage of a power source 71 by using resistors 72 and 73 and output the generated offset voltage via a buffer circuit 74. By this offset power circuit 70, the output signal of the differential amplifier circuit 63 is pulled up toward the positive side by an amount corresponding to the offset voltage. The offset power circuit 70 has an output terminal which is connected to the non-inverted input terminal 631 of the operational amplifier 630.

The impedance circuit 80 is connected to the voltage sensing terminals 61 and 62 so as to increase the impedance between the stabilizing power circuit 90 and the pair of voltage sensing terminals 61 and 62.

The impedance circuit 80 of the present embodiment includes resistors R1 and R2 which are arranged between the pair of voltage sensing terminals 61 and 62 of the voltage detection circuit 60 and the output terminal of the stabilizing power circuit 90. In the resistor R1, one end is connected to a point between voltage sensing terminal 61 and an input resistor R3 of the differential amplifier circuit 63, and the other end is connected to the output terminal of the stabilizing power circuit 90. Similarly, in the resistor R2, one end is connected to a point between the voltage sensing terminal 62 and an input resistor R4 of the differential amplifier circuit 63, and the other end is connected to the output terminal of the stabilizing power circuit 90.

When the output-side switches SL1 and SL2 are turned on in a state where the capacitor 41 is charged, the voltage across the terminals of the capacitor 41 is discharged at the resistors R1 and R2 of the impedance circuit 80. In other words, the discharge of the impedance circuit 80 may reduce the detected voltage of the voltage detection circuit 60 and may adversely affect the accuracy in the voltage detection performed by the voltage detection circuit 60.

In this regard, in the present embodiment, the resistances of the resistors R1 and R2 that configure the impedance circuit 80 are determined such that a time constant of a circuit configured by the impedance circuit 80 and the capacitor 41 becomes longer than a required detection time that is required for the voltage detection circuit 60 to detect the voltage across the terminals of the capacitor 41. The required detection time refers to a time that is taken from when the voltage across the terminals of the capacitor 41 is applied to the voltage sensing terminals 61 and 62 of the voltage detection circuit 60, until when a potential difference between the voltage sensing terminals 61 and 62 is detected by the voltage detection circuit 60.

The stabilizing power circuit 90 is a circuit that, when at least one of the output-side switches SL1 and SL2 is turned off, stabilizes the voltage of at least one of the voltage sensing terminals 61 and 62 on the side of the at least one of the output-side switches SL1 and SL2 that is turned off.

In the present embodiment, the basic configuration of the stabilizing power circuit 90 is similar to that of the offset power circuit 70. Accordingly, the stabilizing power circuit 90 is configured to generate a constant voltage (e.g., 2.5 V) by dividing the voltage of a power source 91 by using resistors 92 and 93 and output the generated constant voltage via a buffer circuit 94. Even when at least one of the output-side switches SL1 and SL2 is turned off, the voltages of the respective voltage sensing terminals 61 and 62 are stabilized by the stabilizing power circuit 90 to a voltage equivalent to the constant voltage.

The control unit 100 is a microcomputer that includes a central processing unit (CPU) and a memory 100*a* that configures a storage means. The control unit 100 is a control means that performs various processes according to a program stored in the memory 100*a*.

The control unit 100 of the present embodiment is configured to control the operation of the input- and output-side switch groups 30 and 50 (control the on/off state of the individual switches). Also, the control unit 100 is configured to perform such a voltage measurement process that converts the detected voltage derived from the voltage detection circuit 60 to a battery voltage and measures the voltage of each battery cell 10. In the present embodiment, switch control means 100*b* corresponds to a part of the control unit 100 that controls the operation of the input- and output-side switch groups 30 and 50.

The voltage measurement process performed by the control unit 100 is briefly described. First, the control unit 100 turns on one of the input-side switches SH1 to SH5 corresponding to a battery cell 10 that is a target of voltage detection. Thus, the voltage of the battery cell 10 being the target of voltage detection is applied to the capacitor 41.

Then, the control unit 100 turns off the input-side switches SH1 to SH5 and turns on the output-side switches SL1 and SL2. Thus, the voltage across the terminals of the capacitor 41, which is equivalent to the voltage of the battery cell 10 which is the target of voltage detection, is applied to the voltage sensing terminals 61 and 62 of the voltage detection circuit 60.

The voltage applied to the voltage sensing terminals 61 and 62 of the voltage detection circuit 60 is amplified by the differential amplifier circuit 63. The amplified voltage is converted to a digital signal by the AD converter 64 and outputted to the control unit 100.

The control unit 100 converts the detected voltage derived from the voltage detection circuit 60 to a battery voltage (cell voltage) to acquire the cell voltage of the battery cell 10 that is the target of voltage detection. The control unit 100 of the present embodiment uses, for example, a control map shown in FIG. 2 and converts the detected voltage derived from the voltage detection circuit 60 to a battery voltage. The control map defines a correlation between detected voltage of the voltage detection circuit 60 and battery voltage. The control unit 100 of the present embodiment takes account of the offset voltage added by the offset power circuit 70 in converting the detected voltage derived from the voltage detection circuit 60 to a battery voltage.

In the voltage monitoring apparatus 2, the output-side switch group 50 has a function of applying the voltage of the capacitor 41 to the voltage sensing terminals 61 and 62 of the voltage detection circuit 60. When the input-side switches SH1 to SH5 are turned on in a state where the output-side switch group 50 fails to be turned off and has been kept on (i.e., an on-failure occurs in the output-side switch group 50), the battery pack 1 is electrically connected with the power source of the voltage monitoring apparatus 2 to cause electric leakage.

In this regard, the control unit 100 of the present embodiment is configured to perform a failure detection process for detecting an on-failure of the output-side switches SL1 and SL2 upon reception of an external command signal or at a predetermined cycle. In the present embodiment, failure detecting means 100*c* corresponds to a part of the control unit 100 for performing the failure detection process.

Hereinafter is described the failure detection process for the output-side switches SL1 and SL2.

In a case where both of the output-side switches SL1 and SL2 normally operate in response to a command signal from the control unit 100, when only one of the output-side switches is turned on, the potential difference between the voltage sensing terminals 61 and 62 will have a value approximate to zero.

Figure 2:
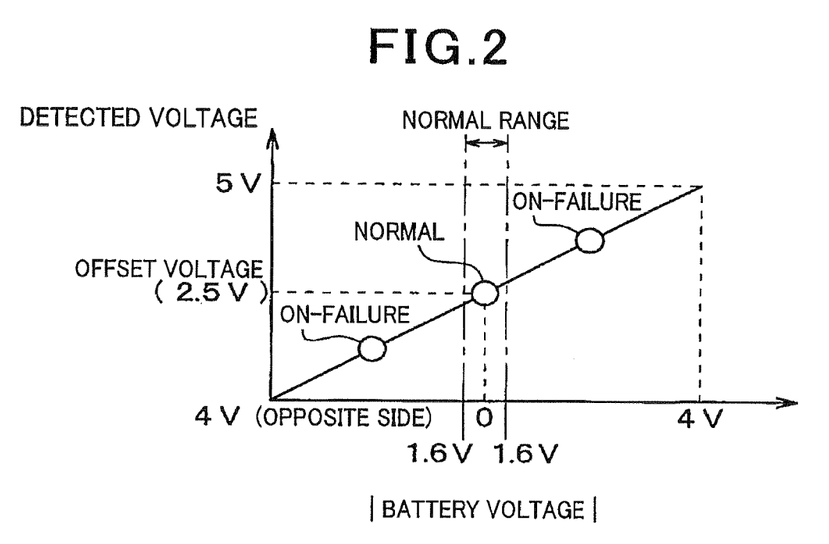
FIG. 2 is a characteristic diagram showing a relationship between detected voltage of a voltage detection circuit and battery voltage.

On the other hand, in a case where one of the output-side switches SL1 and SL2 has an on-failure, when only one of the output-side switches should be turned on, the potential difference between the voltage sensing terminals 61 and 62 will have a value equivalent to that of the voltage across the terminals of the capacitor 41. Specifically, as shown in FIG. 2, when one of the output-side switches SL1 and SL2 has an on-failure, the voltage measured by the control unit 100 will have an absolute value (=|battery voltage|) higher than that in a normal state.

In the failure detection process, the detected voltage of the voltage detection circuit 60 is higher than a predetermined threshold voltage (e.g., 1.6 V) when one of the output-side switches SL1 and SL2 is turned on, the control unit 100 determines that an on-failure has occurred in the other of the output-side switches SL1 and SL2 which should not be turned on. Due to the occurrence of the on-failure, the other of the output-side switches SL1 and SL2 has been kept on and fails to be turned off.

The threshold voltage used in the failure detection process is set to a value between a lower limit value of a voltage range (on range) and an upper limit value of a voltage range (off range). The lower limit value could be measured in a voltage measurement process when both of the output-side switches SL1 and SL2 are turned on. The lower limit value could be measured in the voltage measurement process when one of the output-side switches SL1 and SL2 is turned off.

Next, an example of the failure detection process is described in detail with reference to a flow diagram shown in FIG. 3 and timing diagrams shown in FIGS. 4 and 5. In this example, an on-failure of the second output-side switch SL2 is detected. In the example shown in FIGS. 3 to 5, the on-failure of the output-side switch SL2 is detected by controlling the operation of the input-side switches SH4 and SH5 and the output-side switch SL1.

First, the control unit 100 turns on only the input-side switches SH4 and SH5 of the input-side switch group 30 (step S10). Then, the control unit 100 waits until the charging of the cell voltage of the battery cell 10 to the capacitor 41 is completed (step S20). Upon completion of the charging to the capacitor 41, the control unit 100 turns off the input-side switches SH4 and SH5 (step S30).

Figure 4:
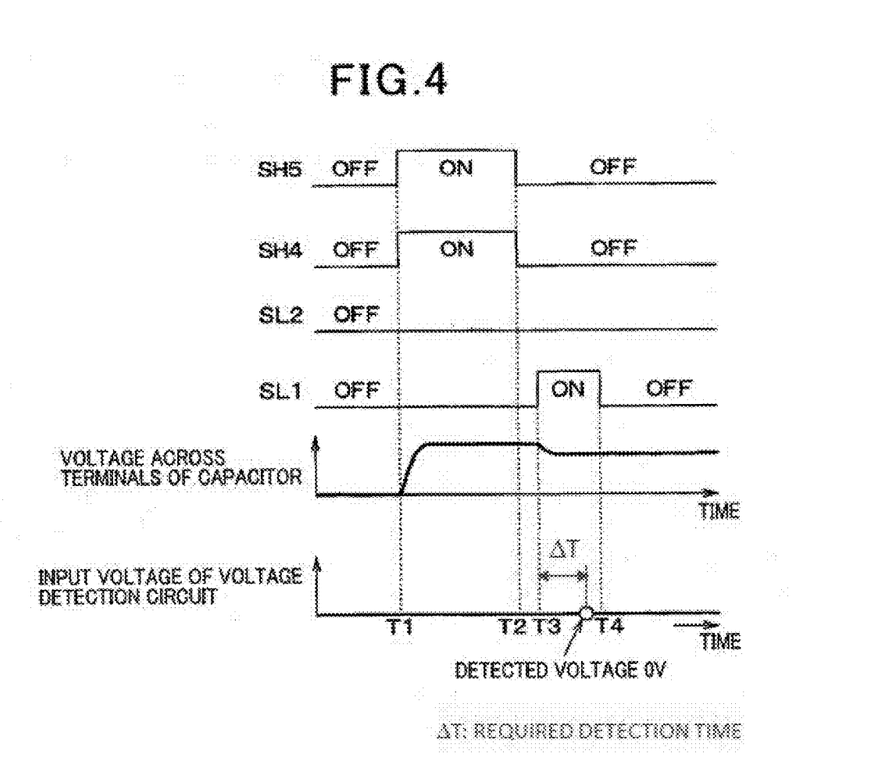
FIG. 4 is a timing diagram showing a normal operation in the failure detection process for output-side switches.
Figure 5:
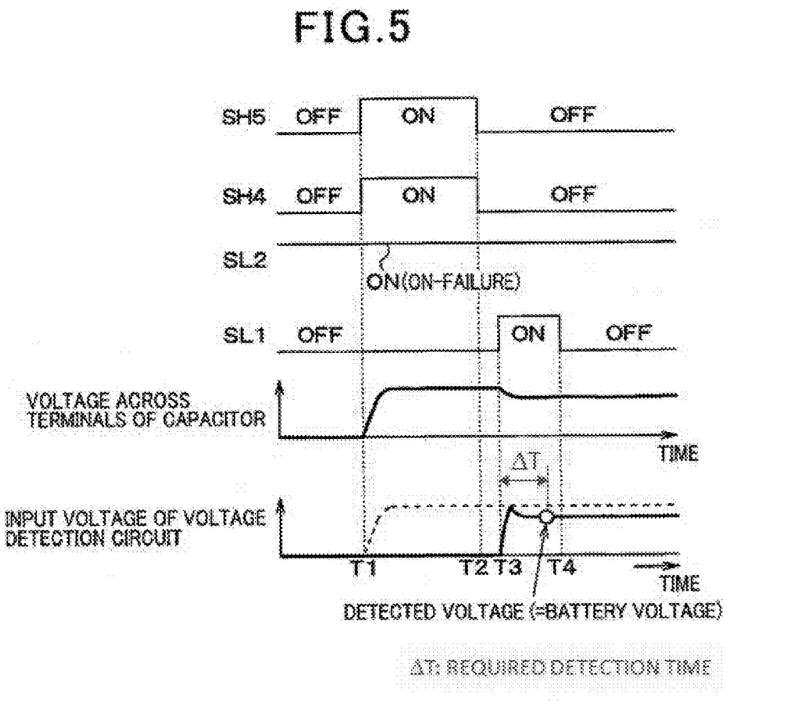
FIG. 5 is a timing diagram showing an operation in the occurrence of an on-failure in the failure detection process for output-side switches.

Thus, the cell voltage of the battery cell 10 targeted to voltage detection is applied to the capacitor 41, and the voltage across the terminals of the capacitor 41 rises up to the cell voltage of the battery cell 10 being the target of voltage detection (see times T1 to T2 of FIGS. 4 and 5). In the present example, the input-side switches SH4 and SH5 are turned on to charge the cell voltage of the battery cell 10 to the capacitor 41. Alternatively to this, other input-side switches SH1 to SH3 may be turned on to charge the cell voltage of the battery cell 10 to the capacitor 41.

Then, the control unit 100 outputs a control signal to the second output-side 20 switch SL2 to command the switch SL2 to be in an off state, while allowing only the first output-side switch SL1 to be in an on state for a time longer than the required detection time ΔT (step S40: see times T3 to T4 of FIGS. 4 and 5).

In this case, as shown in FIG. 4, when the second output-side switch SL2 operates normally in response to the command signal of the control unit 100, the potential difference (input voltage) between the voltage sensing terminals 61 and 62 of the voltage detection circuit 60 has a value approximate to zero.

On the other hand, as shown in FIG. 5, when the second output-side switch SL2 has an on-failure, the voltage across the terminals of the capacitor 41 is applied to the pair of voltage sensing terminals 61 and 62 of the voltage detection circuit 60. Thus, the input voltage of the voltage detection circuit 60 has a value approximate to the voltage across the terminals of the capacitor 41.

The input voltage of the voltage detection circuit 60 decreases with time by the discharge in the impedance circuit 80. However, a time constant of the circuit configured by the impedance circuit 80 and the capacitor 41 is configured to be longer than the required detection time. Then, the input voltage of the voltage detection circuit 60 has a value approximately the same as the voltage across the terminals of the capacitor 41.

After that, the control unit 100 acquires the detected voltage from the voltage detection circuit 60 and converts the acquired detected voltage to a battery voltage (step S50). Then, the control unit 100 determines whether or not the absolute value of the battery voltage is equal to or smaller than the predetermined threshold voltage (e.g., 1.6 V) (step S60).

As a result of the determination at step S60, if the absolute value of the battery voltage is determined to be smaller than the threshold voltage (YES at step S60), it is determined that the second output-side switch SL2 is in a normal state of operating in response to the control command of the control unit 100. Then, the process is halted until the next iteration.

On the other hand, as a result of the determination at step S60, if the absolute value of the battery voltage is determined to be equal to or larger than the threshold voltage (NO at step S60), it is determined that the second output-side switch SL2 has an on-failure. Then, the process is halted until the next iteration.

Figure 3:
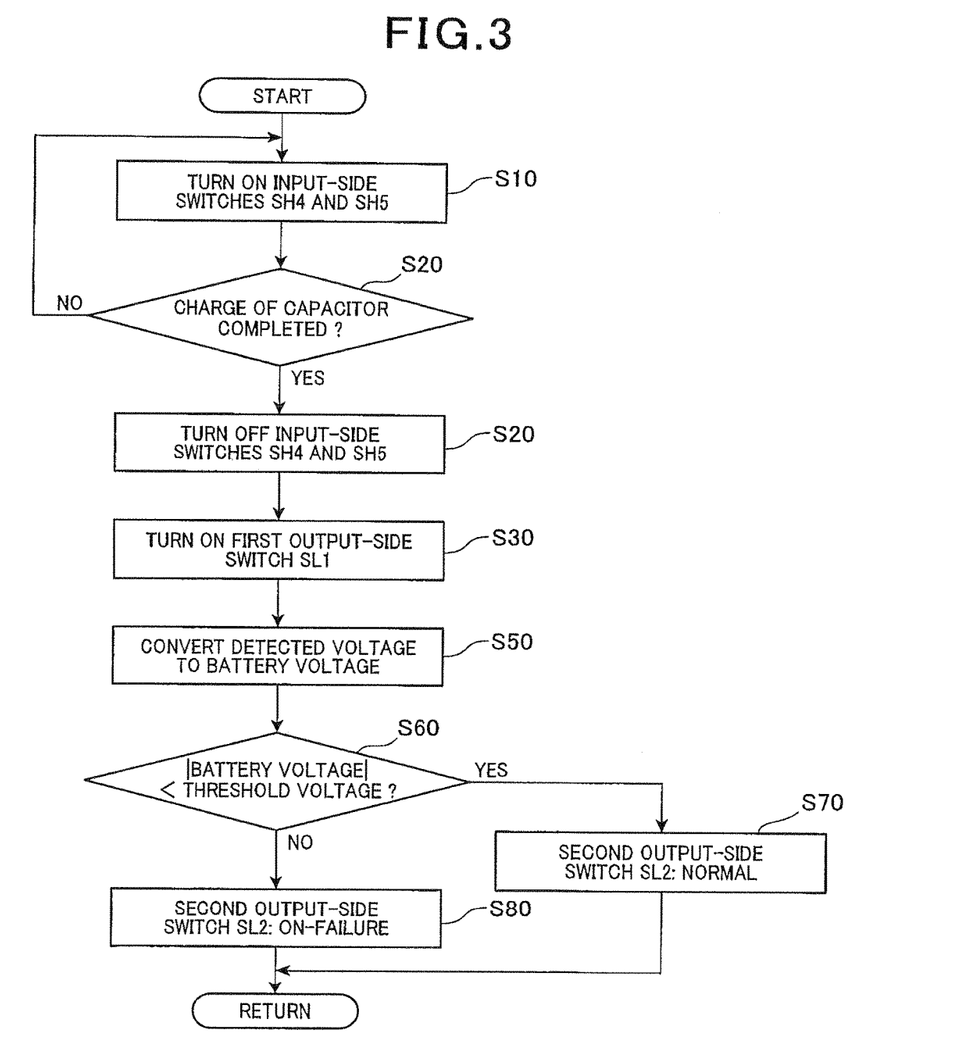
FIG. 3 is a flow diagram showing a failure detection process for output-side switches performed by a control unit, according to the first embodiment.

In the case of detecting an on-failure of the first output-side switch SL1, the control unit 100 allows only the second output-side switch SL2 to be in an on state, at step S40 of FIG. 3, for a time longer than the required detection time. In this case, the battery voltage resulting from the conversion of the detected voltage of the voltage detection circuit 60 may be compared with the threshold voltage to make a determination.

According to the present embodiment described so far, the voltage monitoring apparatus 2 is configured such that the pair of voltage sensing terminals 61 and 62 is connected to the stabilizing power circuit 90 via the impedance circuit 80. With this configuration, even when one of the output-side switches SL1 and SL2 is turned on and the other of them is turned off, the impedance circuit 80 and the stabilizing power circuit 90 can stabilize the voltage of any of the voltage sensing terminals 61 and 62 on the side of the other of the output-side switches that has been turned off.

Accordingly, when one of the output-side switches SL1 and SL2 is turned on, the potential difference between the voltage sensing terminals 61 and 62 can be normally detected by the voltage detection circuit 60. Thus, the voltage monitoring apparatus 2 of the present embodiment enables detection of an on-failure of the output-side switches LS1 and LS2.

Further, in the voltage monitoring apparatus 2 of the present embodiment, the resistances of the resistors R1 and R2 that configure the impedance circuit 80 are determined such that the time constant of the circuit configured by the impedance circuit 80 and the capacitor 41 becomes longer than the required detection time. This configuration is able to minimize the decrease in the detected voltage of the voltage detection circuit 60 that is attributed to the impact of the discharge of the impedance circuit 80. As a result, when one of the output-side switches SL1 and SL2 is turned on, the potential difference between the voltage sensing terminals 61 and 62 is accurately detected by the voltage detection circuit 60.

Second Embodiment

Figure 6:
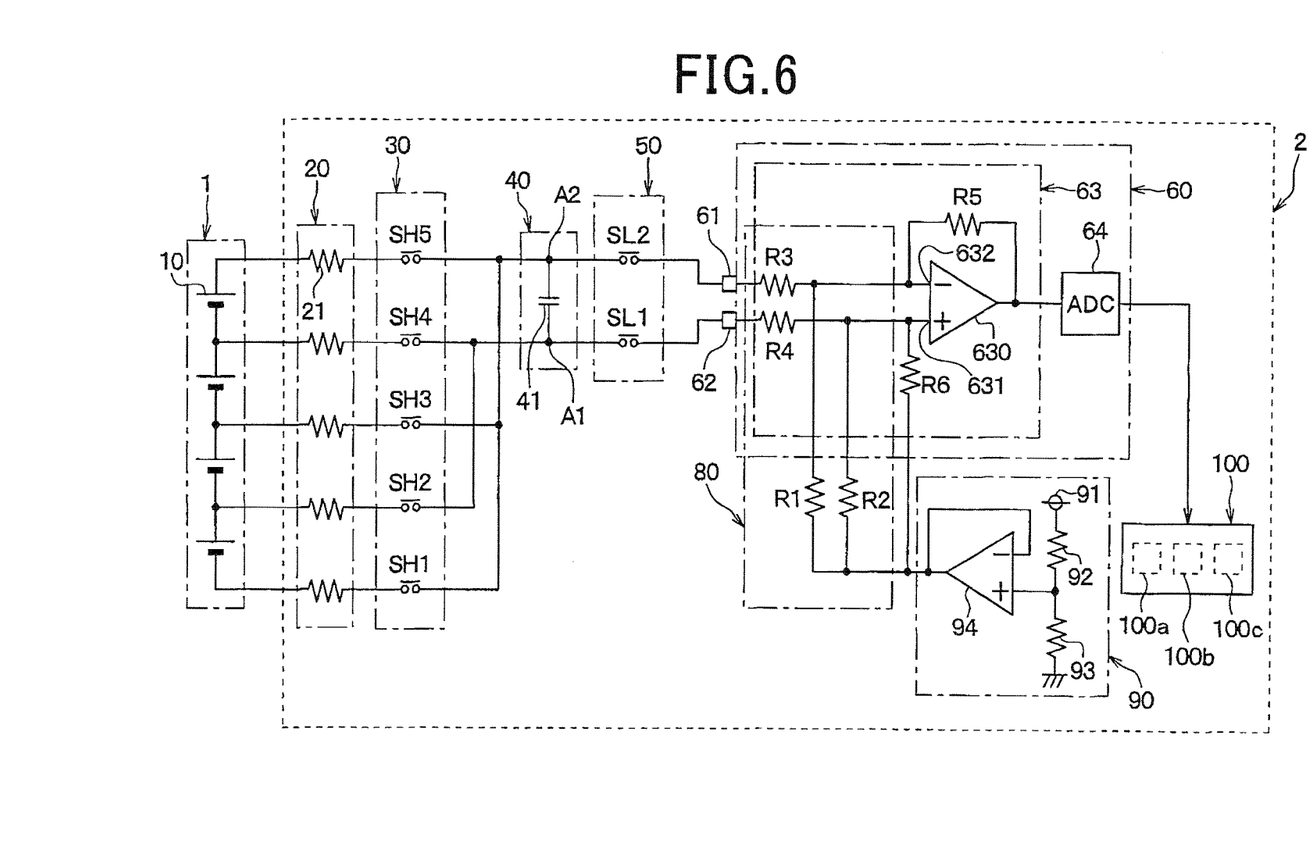
FIG. 6 is a schematic diagram generally showing a voltage monitoring apparatus, according to a second embodiment of the present invention.

Next, a second embodiment of the present invention is described. The present embodiment deals with an example in which the circuit configurations of the impedance circuit 80 and the stabilizing power circuit 90 are modified from those of the first embodiment. In the present embodiment, description is omitted or simplified regarding the components similar to or identical with those of the first embodiment.

As shown in FIG. 6, in the second embodiment, the output side of the buffer circuit 94 of the stabilizing power circuit 90 is connected to: i) a connecting point between the input resistor R3 of the differential amplifier circuit 63 and the input terminal 632 of the operational amplifier 630 via the resistor R1 of the impedance circuit 80; and ii) a connecting point between the input resistor R4 of the differential amplifier circuit 63 and the input terminal 631 of the operational amplifier 630 via the resistor R2 of the impedance circuit 80.

The input resistors R3 and R4 of the present embodiment configure a part of the differential amplifier circuit 63, while functioning as resistance components of the impedance circuit 80. In other words, the impedance circuit 80 of the present embodiment is configured to include the input resistors R3 and R4 of the differential amplifier circuit 63.

The offset power circuit 70 is removed is the present embodiment. Instead, the output side of the stabilizing power circuit 90 is connected to the non-inverted input terminal 631 of the differential amplifier circuit 63 via the resistor R6 of the differential amplifier circuit 63. In other words, in the present embodiment, the output signal of the differential amplifier circuit 63 is pulled up toward the positive side by the stabilizing power circuit 90 by an amount corresponding to the constant voltage.

The rest of the configuration and operation is similar to the first embodiment. The configuration of the present embodiment can provide the following advantageous effects in addition to those of the first embodiment.

Specifically, in the present embodiment, the input resistors R3 and R4 of the differential amplifier circuit 63 function as resistance components of the impedance circuit 80. Accordingly, the time constant can be made longer in the circuit configured by the impedance circuit 80 and the capacitor 41.

This makes it possible to minimize variation in the detected voltage (deterioration in the detection accuracy of the voltage detection circuit 60) caused by the discharge in the impedance circuit 80 in turning on the output-side switches SL1 and SL2.

In the present embodiment, the stabilizing power circuit 90 also functions as the offset power circuit 70. Accordingly, compared to the first embodiment, the voltage monitoring apparatus 2 can be realized with a simplified circuit configuration.

As described above, in the circuit configuration of the present embodiment, the input resistors R3 and R4 of the differential amplifier circuit 63 are allowed to function as resistance components of the impedance circuit 80, while the stabilizing power circuit 90 is allowed to function as the offset power circuit 70. However, the circuit configuration is not limited to this.

For example, the voltage monitoring apparatus 2 may have a circuit configuration in which the input resistors R3 and R4 of the differential amplifier circuit 63 only function as resistance components of the impedance circuit 80, or may have a circuit configuration in which the stabilizing power circuit 90 only functions as the offset power circuit 70. This applies to the following embodiments as well.

Third Embodiment

Next, a third embodiment of the present invention is described. The present embodiment deals with an example in which the circuit configuration of the input-side switch group 30 of the second embodiment has been modified. In the third embodiment, description is omitted or simplified regarding the components similar to or identical with those of the foregoing embodiments.

Figure 7:
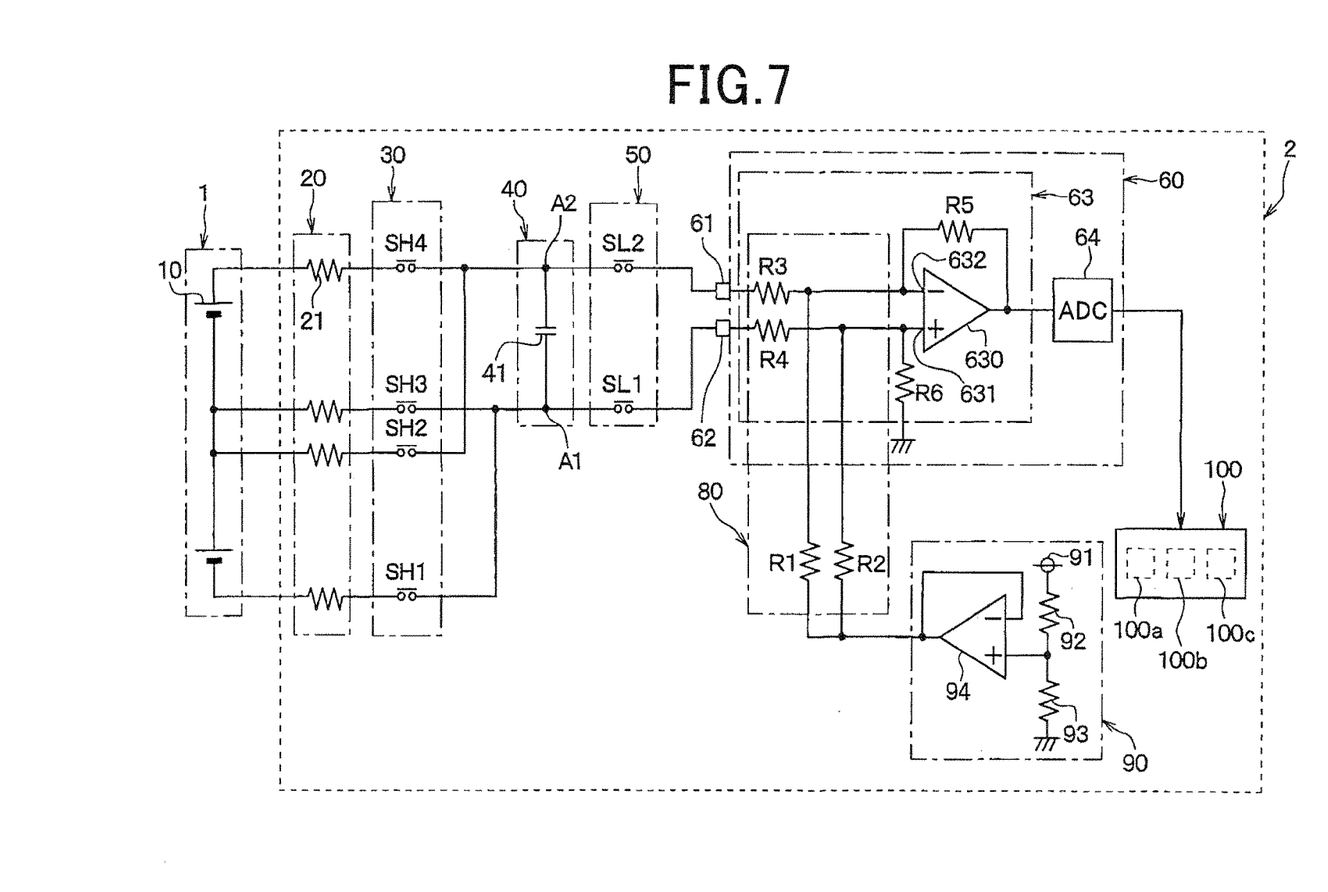
FIG. 7 is a schematic diagram generally showing a voltage monitoring apparatus, according to a third embodiment of the present invention.

The third embodiment is described referring to FIG. 7. FIG. 7 is a schematic diagram generally illustrating a voltage monitoring apparatus 2 according to the third embodiment. For the sake of convenience, FIG. 7 shows an example of a configuration in which the battery pack 1 is configured by two battery cells 10. However, the number of the battery cells 10 configuring the battery pack 1 is not limited to two.

The input-side switch group 30 of the present embodiment includes a plurality of input-side switches SH1 to SH4 which are separately connected across the terminals of the individual battery cells 10, so that the polarity of the voltage of the capacitor 41 is not inverted in sequentially applying the voltages of adjacent battery cells 10 to the capacitor 41. Specifically, in adjacent battery cells 10 of the present embodiment, an input-side switch connected to the negative terminal of a high potential-side battery cell 10 is provided separately from an input-side switch connected to the positive terminal of a low potential-side battery cell 10.

For example, in adjacent battery cells 10, when the high potential-side battery cell 10 is targeted for voltage detection, the control unit 100 turns on the input-side switches SH3 and SH4 that correspond to the targeted battery cell 10. Thus, the capacitor 41 is applied with the cell voltage of the high potential-side battery cell 10. Also, in adjacent battery cells 10, when the low potential-side battery cell 10 is targeted for voltage detection, the control unit 100 turns on the input-side switches SH1 and SH2 that correspond to the targeted battery cell 10. Thus, the capacitor 41 is applied with the cell voltage of the low potential-side battery cell 10, whose polarity is the same as that of the cell voltage of the high potential-side battery cell 10.

In the circuit configuration of the present embodiment, the AD converter 64 does not receive an input of an analog signal having a negative voltage. Therefore, the offset power circuit 70 is omitted from the circuit configuration. Specifically, the resistor R6 of the differential amplifier circuit 63 is configured to be grounded.

The rest of the configuration and operation is similar to the first and second embodiments. The configuration of the present embodiment can provide the following advantageous effects in addition to those described in the first and second embodiments.

Specifically, in the present embodiment, the input-side switch group 30 is configured such that the polarity of the voltage of the capacitor 41 will not be inverted in sequentially applying the voltages of adjacent battery cells 10 to the capacitor 41. Thus, the offset power circuit 70 can be omitted and the omission contributes to simplifying the circuit configuration of the voltage detection circuit 60. In the circuit configuration of the present embodiment, the offset power circuit 70, although it is desired to be omitted, may be provided as in the foregoing embodiment.

Fourth Embodiment

Next, a fourth embodiment of the present invention is described. In the present embodiment, description is omitted or simplified regarding the components similar to or identical with those of the first and second embodiments.

Figure 8:
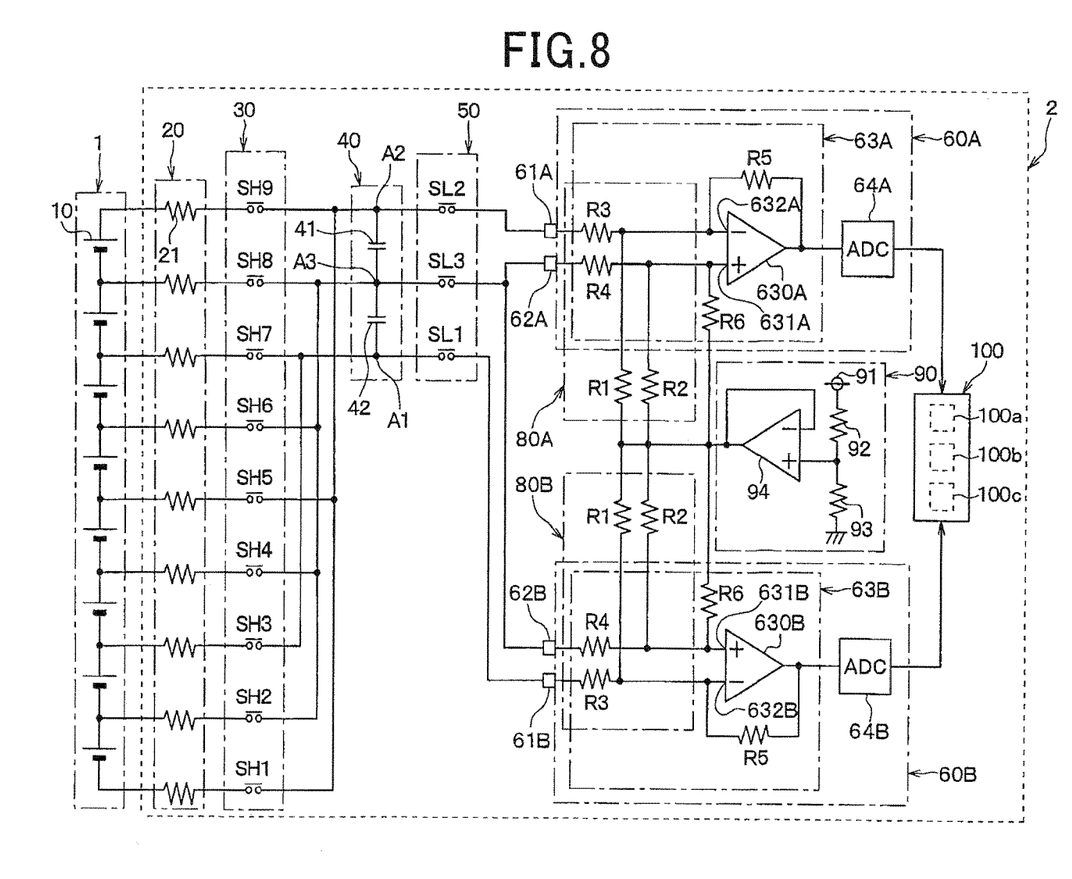
FIG. 8 is a schematic diagram generally showing a voltage monitoring apparatus, according to a fourth embodiment of the present invention.

The present embodiment is described with reference to FIG. 8. FIG. 8 is a schematic diagram generally illustrating a voltage monitoring apparatus 2 according to the fourth embodiment. For the sake of convenience, FIG. 8 shows an example of a configuration in which the battery pack 1 is configured by eight battery cells 10. However, the number of the battery cells 10 configuring the battery pack 1 is not limited to eight.

As shown in FIG. 8, the voltage monitoring apparatus 2 of the present embodiment has a configuration based on a double flying capacitor method. In the configuration based on the double flying capacitor method, the capacitor circuit 40 includes a serial connection, in which two capacitors 41 and 42 are connected in series, to concurrently measure the cell voltages of adjacent battery cells 10.

The input-side switch group 30 of the present embodiment includes a plurality of input-side switches SH1 to SH9 which are connected across the terminals of the individual battery cells 10. In the present embodiment, when the electrode terminals of the battery cells 10 are counted in an ascending order of the potential, the input-side switches SH3 and SH7 connected to the electrode terminals of $[4m-1]^{th}$ order (m is a positive integer) are connected to one end A1 of the serial connection of the capacitors 41 and 42 (where one end A1 of the serial connection is connected to one terminal of the capacitor 42).

Similarly, the input-side switches SH1, SH5 and SH9 connected to the electrode terminals of $[4m-3]^{th}$ order are connected to the other end A2 of the serial connection of the capacitors 41 and 42 (where the other end A2 of the serial connection is connected to one terminal of the capacitor 41).

Similarly, the input-side switches SH2, SH4, SH6 and SH8 connected to the electrode terminals of $[2m]^{th}$ order are connected to a connecting portion A3 between the capacitors 41 and 42 (where the connecting portion A3 is connected between the other terminal of the capacitor 41 and the other terminals of the capacitor 42).

Thus, the control unit 100 turns on the input-side switches connected across the terminals of individual adjacent battery cells 10 to apply the cell voltages of the adjacent battery cells 10 to the capacitors 41 and 42. For example, when the control circuit 100 turns on the input-side switches SH1 to SH3 connected across the terminals of the individual low potential-side battery cells 10, the cell voltages of the low potential-side battery cells 10 are applied to the capacitors 41 and 42.

The output-side switch group 50 of the present embodiment includes three output-side switches SL1 to SL3. Specifically, the output-side switch group 50 is configured by a first output-side switch SL1 connected to one end A1 of the serial connection of the serially connected capacitors 41 and 42, a second output-side switch SL2 connected to the other end A2, and a third output-side switch SL3 connected to the connecting portion A3 of the capacitors 41 and 42.

In the present embodiment, the capacitors 41 and 42 are separately provided with first and second voltage detection circuits 60A and 60B, respectively. The voltage detection circuits 60A and 60B each have a configuration similar to that of the voltage detection circuit 60 described in the first embodiment.

Specifically, the first voltage detection circuit 60A detects a potential difference between a pair of voltage sensing terminals 61A and 62A which correspond to both terminals of the capacitor 41 (where one terminal of the capacitor 41 is connected to the other end A2 of the serial connection of the capacitors 41 and 42, and the other terminal of the capacitor 41 is connected to the connection point A3 between the capacitors 41 and 42). The first voltage detection circuit 60A includes the pair of voltage sensing terminals 61A and 62A, a differential amplifier circuit 63A and an AD converter 64A.

The second voltage detection circuit 60B detects a potential difference between a pair of voltage sensing terminals 61B and 62B which correspond to terminals A1 and of the capacitor 42 (where one terminal of the capacitor 42 is connected to one end A1 of the serial connection of the capacitors 41 and 42, and the other terminal of the capacitor 42 is connected to the connection point A3 between the capacitors 41 and 42). The second voltage detection circuit 60B includes the pair of voltage sensing terminals 61B and 62B, a differential amplifier circuit 63B and an AD converter 64B.

In the present embodiment, the voltage detection circuits 60A and 60B are separately provided with first and second impedance circuits 80A and 80B, respectively. The output terminal of a single stabilizing power circuit 90 is connected to the voltage sensing terminals 61A, 61B, 62A and 62B of the voltage detection circuits 60A and 6B via the impedance circuits 80A and 80B, respectively. The stabilizing power circuit 90 of the present embodiment is connected to the resistors R6 of the differential amplifier circuits 63A and 63B so as to also function as an offset power circuit.

Next, a voltage measurement process performed by the control unit 100 of the present embodiment is briefly described.

First, when adjacent battery cells 10 are targets of voltage detection, the control unit 100 turns on the input-side switches SH1 to SH8, which correspond to the battery cells 10 being the targets of voltage detection. Thus, the cell voltages of the battery cells 10 being the targets of voltage detection are applied to the capacitors 41 and 42.

Then, the control unit 100 turns off the input-side switches SH1 to SH8 and turns on the output-side switches SL1 to SL3. Thus, the voltage across the terminals of the capacitor 41 is applied to the voltage sensing terminals 61A and 62A of the first voltage detection circuit 60A. Also, the voltage across the terminals of the capacitor 42 is applied to the voltage sensing terminals 61B and 62B of the second voltage detection circuit 60B.

The voltages applied to the voltage sensing terminals 61A, 61B, 62A and 62B of the voltage detection circuits 60A and 60B are amplified by the differential amplifier circuits 63A and 63B, respectively. The amplified voltages are converted to digital signals by the AD converters 64A and 64B and outputted to the control unit 100. The control unit 100 then converts the detected voltages of the voltage detection circuits 60A and 60B to respective battery voltages to acquire the cell voltages of the respective battery cells 10 that are targets of voltage detection.

Hereinafter is briefly described a failure detection process performed by the control unit 100 of the present embodiment. When only one of the output-side switches SL1 to SL3 is turned on in a state where the output-side switches all normally operate in response to command signals of the control unit 100, the potential difference between the voltage sensing terminals 61A and 62A and the potential difference between the voltage sensing terminals 61B and 62B will have a value approximate to zero.

On the other hand, when one of the output-side switches SL1 to SL3 has an on-failure, each voltage measured by the control unit 100 will have an absolute value (=|battery voltage|) higher than in a normal state.

For example, in a case where one of the first and second output-side switches SL1 and SL2 has an on-failure, when only the third output-side switch SL3 is turned on, one of the potential differences between the voltage sensing terminals 61A and 62A and between the voltage sensing terminals 61B and 62B will have a value equivalent to the voltage across the serial connection of the capacitors 41 and 42.

Also, in a case where the third output-side switch SL3 has an on-failure, when only one of the first and second output-side switches SL1 and SL2 is turned on, one of the potential differences between the voltage sensing terminals 61A and 62A and between the voltage sensing terminals 61B and 62B will have a value equivalent to the voltage across the serial connection of the capacitors 41 and 42.

Thus, in the failure detection process of the present embodiment, the on-failure of the first and second output-side switches SL1 and SL2 is detected on the basis of the detected voltages of the voltage detection circuits 60A and 60B in turning on the third output-side switch SL3.

Specifically, the control unit 100 converts the detected voltage of the second voltage detection circuit 60B to a battery voltage, the detected voltage being obtained in turning on the third output-side switch SL3. If the converted voltage has a value larger than a predetermined threshold voltage, the control unit 100 determines that the first output-side switch SL1 has an on-failure.

Also, the control unit 100 converts the detected voltage of the first voltage detection circuit 60A to a battery voltage, the detected voltage being obtained in turning on the third output-side switch SL3. If the converted voltage has a value larger than a predetermined threshold voltage, the control unit 100 determines that the second output-side switch SL2 has an on-failure.

Further, in the failure detection process of the present embodiment, the on-failure of the third output-side switch SL3 is detected on the basis of the detected voltage of the first voltage detection circuit 60A in turning on the first output-side switch SL1, or the detected voltage of the second voltage detection circuit 60B in turning on the second output-side switch SL2.

Specifically, when a value resulting from the conversion of one of the detected voltages of the voltage detection circuits 60A and 60B in turning on one of the first and second output-side switches SL1 and SL2 is larger than the predetermined threshold voltage, the control unit 100 determines that the third output-side switch SL 3 has an on-failure.

The rest of the configuration and operation is similar to the foregoing embodiments. The configuration of the present embodiment can provide the following advantageous effects in addition to those described in the foregoing embodiments.

Specifically, in the present embodiment, the voltage monitoring apparatus 2 has a configuration based on double flying capacitor method that enables concurrent measurement of the cell voltages of adjacent battery cells 10. This configuration is able to shorten the time taken for the measurements, for example, of the cell voltages of the respective battery cells 10.

In the present embodiment, the stabilizing power circuit 90 is shared between the voltage detection circuits 60A and 60B. However, the configuration is not limited to this. For example, the voltage detection circuits 60A and 60B may be separately provided with a stabilizing power circuit 90. Further, in the present embodiment, the stabilizing power circuit 90 is permitted to function as an offset power circuit. Alternative to this, an offset power circuit may be separately provided.

Other Embodiments

Some embodiments of the present invention have so far been described. It is not that the foregoing embodiments have no relation to each other. The forgoing embodiments may be implemented in combination, unless the combination is clearly regarded to be improper.

As a matter of course, the components configuring the foregoing embodiments are not necessarily essential, unless the components are explicitly mentioned as being essential and are considered to be essential in principle.

Further, the numerical values, such as the number of components, numerical values, amounts and ranges, when referred to in the foregoing embodiments, are not limited to the specified numerical values, unless essentiality is particularly and explicitly mentioned, or unless the numerical values are apparently limited to the specified numerical values in principle. Furthermore, the shapes, positional relationships and the like of the components, when referred to in the foregoing embodiments, are not limited to these shapes, positional relationships and the like, unless limitation is particularly and explicitly mentioned, or unless the shapes, positional relationships and the like are limited in principle to specified ones.

The present invention is not limited to the foregoing embodiments but may be variously modified as appropriate within the scope of the claims. For example, the present invention may be modified as provided below.

(1) As in the foregoing embodiments, it is desirable that the resistances of the resistors R1 and R2 of the impedance circuit 80 are determined such that the time constant of the circuit configured by the impedance circuit 80 and the capacitor 41 becomes longer than the required detection time. However, this shall not impose a limitation. The resistances of the resistors R1 and R2 of the impedance circuit 80 may be determined so as to fall within a range of enabling detection of an on-failure of the output-side switches SL1 and SL2 in the voltage monitoring apparatus 2.

(2) The foregoing embodiments each deal with an example of a circuit configuration in which AD conversion is enabled when an analog signal inputted to the AD converter 64 has a positive voltage. However, this shall not impose a limitation. In the circuit configuration, AD conversion may also be enabled when an analog signal has a negative voltage.

(3) In the foregoing embodiments each deal with an example in which the voltage monitoring apparatus 2 of the present invention is applied to the battery pack 1 in which a plurality of battery cells 10 are connected in series. However, this shall not impose a limitation. For example, the present invention may be applied to a single battery cell 10, or to a battery pack in which a plurality of battery cells 10 are connected in parallel.

(4) The foregoing embodiments each deal with an example in which the voltage monitoring apparatus 2 is applied to an in-vehicle high-voltage battery. However, not being limited to an in-vehicle high-voltage battery, the present invention may be applied to other batteries.

What is claimed is:
1. A voltage monitoring apparatus comprising:
a capacitor circuit including at least one capacitor;
an input-side switch group that includes a plurality of input-side switches connected to at least one pair of electrode terminals of at least one battery cell, the input-side switch group applying voltage to a pair of terminals of the at least one capacitor;
a voltage detection circuit that includes at least one pair of voltage sensing terminals connected to each of the terminals of the at least one capacitor, the voltage detection circuit detecting a potential difference across the at least one pair of voltage sensing terminals;

an output-side switch group that includes a plurality of output-side switches connected to the terminals of the at least one capacitor, the output-side switch group applying voltage across the terminals of the at least one capacitor to the at least one pair of voltage sensing terminals;

switch control means for controlling each of the plurality of input-side switches and each of the plurality of output-side switches;

failure detecting means for detecting, on the basis of the voltage detected by the voltage detection circuit when one of the output-side switches is turned on, an on-failure of at least one of the remaining output-side switches which should not be turned on;

an impedance circuit that is connected to each of the at least one pair of voltage sensing terminals, the impedance circuit being connected to each of the plurality of output-side switches, connected to the terminals of the at least one capacitor, via the each of the at least one pair of voltage sensing terminals; and a stabilizing power circuit that is connected to each of the at least one pair of voltage sensing terminals via the impedance circuit and stabilizes voltage of each of the at least one pair of voltage sensing terminals, wherein the impedance circuit is configured such that a time constant of a circuit configured by the impedance circuit and the at least one capacitor, which are connected to each other via each of the plurality of output-side switches and the each of the at least one pair of voltage sensing terminals, becomes longer than a required detection time that is taken from when a voltage across the terminals of the at least one capacitor is applied to the at least one pair of voltage sensing terminals until when a potential difference between the at least one pair of voltage sensing terminals is detected by the voltage detection circuit, the voltage detection circuit includes a differential amplifier circuit that amplifies and outputs at least one potential difference between the at least one pair of voltage sensing terminals;

the differential amplifier circuit includes at least one pair of input resistors connected to the at least one pair of voltage sensing terminals; and the stabilizing power circuit is connected to each of the at least one pair of voltage sensing terminals via the at least one pair of input resistors.

2. The voltage monitoring apparatus according to claim 1, wherein:

the stabilizing power circuit is connected to the at least one pair of voltage sensing terminals and is connected to one input terminal of the differential amplifier circuit such that a predetermined offset voltage is added to an output signal of the differential amplifier circuit.

3. The voltage monitoring apparatus according to claim 1, wherein the at least one battery cell is a plurality of battery cells configuring a battery pack which is installed in a vehicle.

4. The voltage monitoring apparatus according to claim 1, wherein the stabilizing power circuit includes a power source, resistors, and a buffer circuit, and generates a constant voltage by dividing a voltage of the power source by using the resistors and output the generated constant voltage via the buffer circuit.

5. The voltage monitoring apparatus according to claim 1, wherein the at least one pair of input resistors is connected to the at least one pair of voltage sensing terminals on a first side of the at least one pair of input resistors and connected to input terminals of a differential amplifier of the differential amplifier circuit on a second side of the at least one pair of input resistors; and the stabilizing power circuit is connected to each of the at least one pair of voltage sensing terminals via the impedance circuit on a first side of the at least one pair of input resistors.

6. The battery system according to claim 5, further comprising an offset power circuit configured to generate an offset voltage and having an output terminal connected to the second side of one of the input resistors of the differential amplifier circuit and to one of the input terminals of the differential amplifier of the differential amplifier circuit.

7. A battery system comprising:

a battery pack that is configured by at least one battery cell; and a voltage monitoring apparatus that includes:

a capacitor circuit including at least one capacitor;

an input-side switch group that includes a plurality of input-side switches connected to at least one pair of electrode terminals of the at least one battery cell, the input-side switch group applying voltage to a pair of terminals of the at least one capacitor;

a voltage detection circuit that includes at least one pair of voltage sensing terminals connected to each of the terminals of the at least one capacitor, the voltage detection circuit detecting a potential difference across the at least one pair of voltage sensing terminals;

an output-side switch group that includes a plurality of output-side switches connected to the terminals of the at least one capacitor, the output-side switch group applying voltage across the terminals of the at least one capacitor to the at least one pair of voltage sensing terminals;

switch control means for controlling each of the plurality of input-side switches and each of the plurality of output-side switches;

failure detecting means for detecting, on the basis of the voltage detected by the voltage detection circuit when one of the output-side switches is turned on, an on-failure of at least one of the remaining output-side switches which should not be turned on;

an impedance circuit that is connected to each of the at least one pair of voltage sensing terminals, the impedance circuit being connected to each of the plurality of output-side switches, connected to the terminals of the at least one capacitor, via the each of the at least one pair of voltage sensing terminals; and a stabilizing power circuit that is connected to each of the at least one pair of voltage sensing terminals via the impedance circuit and stabilizes voltage of each of the at least one pair of voltage sensing terminals, wherein the impedance circuit is configured such that a time constant of a circuit configured by the impedance circuit and the at least one capacitor, which are connected to each other via each of the plurality of output-side switches and the each of the at least one pair of voltage sensing terminals, becomes longer than a required detection time that is taken from when a voltage across the terminals of the at least one capacitor is applied to the at least one pair of voltage sensing terminals until when a potential difference between the at least one pair of voltage sensing terminals is detected by the voltage detection circuit, the voltage detection circuit includes a differential amplifier circuit that amplifies and outputs at least one potential difference between the at least one pair of voltage sensing terminals;

the differential amplifier circuit includes at least one pair of input resistors connected to the at least one pair of voltage sensing terminals; and the stabilizing power circuit is connected to each of the at least one pair of voltage sensing terminals via the at least one pair of input resistors.

8. The battery system according to claim 7, wherein the stabilizing power circuit includes a power source, resistors, and a buffer circuit, and generates a constant voltage by dividing a voltage of the power source by using the resistors and output the generated constant voltage via the buffer circuit.

9. The voltage monitoring apparatus according to claim 7, wherein the at least one pair of input resistors is connected to the at least one pair of voltage sensing terminals on a first side of the at least one pair of input resistors and connected to input terminals of a differential amplifier of the differential amplifier circuit on a second side of the at least one pair of input resistors; and the stabilizing power circuit is connected to each of the at least one pair of voltage sensing terminals via the impedance circuit on a first side of the at least one pair of input resistors.

10. The battery system according to claim 9, further comprising an offset power circuit configured to generate an offset voltage and having an output terminal connected to the second side of one of the input resistors of the differential amplifier circuit and to one of the input terminals of the differential amplifier of the differential amplifier circuit.

\* \* \* \* \*